(12) United States Patent
Chou et al.

(10) Patent No.: US 7,577,043 B2
(45) Date of Patent: Aug. 18, 2009

(54) VOLTAGE REGULATOR FOR SEMICONDUCTOR MEMORY

(75) Inventors: Min-Chung Chou, Hsinchu (TW); Tse-Hua Yao, Kellung (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 84 days.

(21) Appl. No.: 11/953,077

(22) Filed: Dec. 10, 2007

(65) Prior Publication Data

US 2009/0147594 A1 Jun. 11, 2009

(51) Int. Cl.
*G11C 16/04* (2006.01)
(52) U.S. Cl. .................. 365/189.09; 365/189.07; 365/189.11; 365/207
(58) Field of Classification Search .......... 365/189.09, 365/189.11, 189.07, 207, 298, 205, 226
See application file for complete search history.

(56) References Cited

U.S. PATENT DOCUMENTS 5,909,402 A * 6/1999 Joo .................. 365/189.07
6,195,298 B1 2/2001 Furutani et al.

* cited by examiner

*Primary Examiner*—David Lam
(74) *Attorney, Agent, or Firm*—Jianq Chyun IP Office (57) ABSTRACT

A voltage regulator in a semiconductor memory has: a comparing unit including first and second bias current sources, for comparing an output voltage with first and second reference voltages under control of a first signal, the second bias current source being ON under control of a second signal; and a driver active element, coupled to the comparing unit, for outputting the output voltage. Before sensing operations, the output voltage is reset to the second reference voltage. During the sensing operations, the output voltage is maintained at the first reference voltage and the second signal is asserted for turning ON the second bias current source for raising speed of the comparing unit. After the sensing operations, the output voltage is reset to the second reference voltage.

17 Claims, 6 Drawing Sheets

VOLTAGE REGULATOR FOR SEMICONDUCTOR MEMORY

BACKGROUND OF THE INVENTION

1. Field of Invention

The present invention relates to a voltage regulator in semiconductor memory. More particularly, the present invention relates to a voltage down converter in dynamic random access memory (DRAM).

2. Description of Related Art

Along with the rapid development of science and technology at the present, semiconductor memories, as major storage devices for large amount of data are being developed to have larger and larger capacity. As the semiconductor technology is continuously scaled down to achieve high memory density, on-chip voltage regulators providing lower supply voltage for internal circuits are required to fulfill the requirements for high device reliability and low power consumption. For DRAM, the bit line sensing, restoring and pre-charge operations in the memory cell arrays consume current abruptly and heavily. For high density DRAM chip, it is challenging to design on-chip voltage regulators for memory cell arrays providing a stable voltage level (Vsa) with sufficient and appropriate supplying current.

Figure 1:
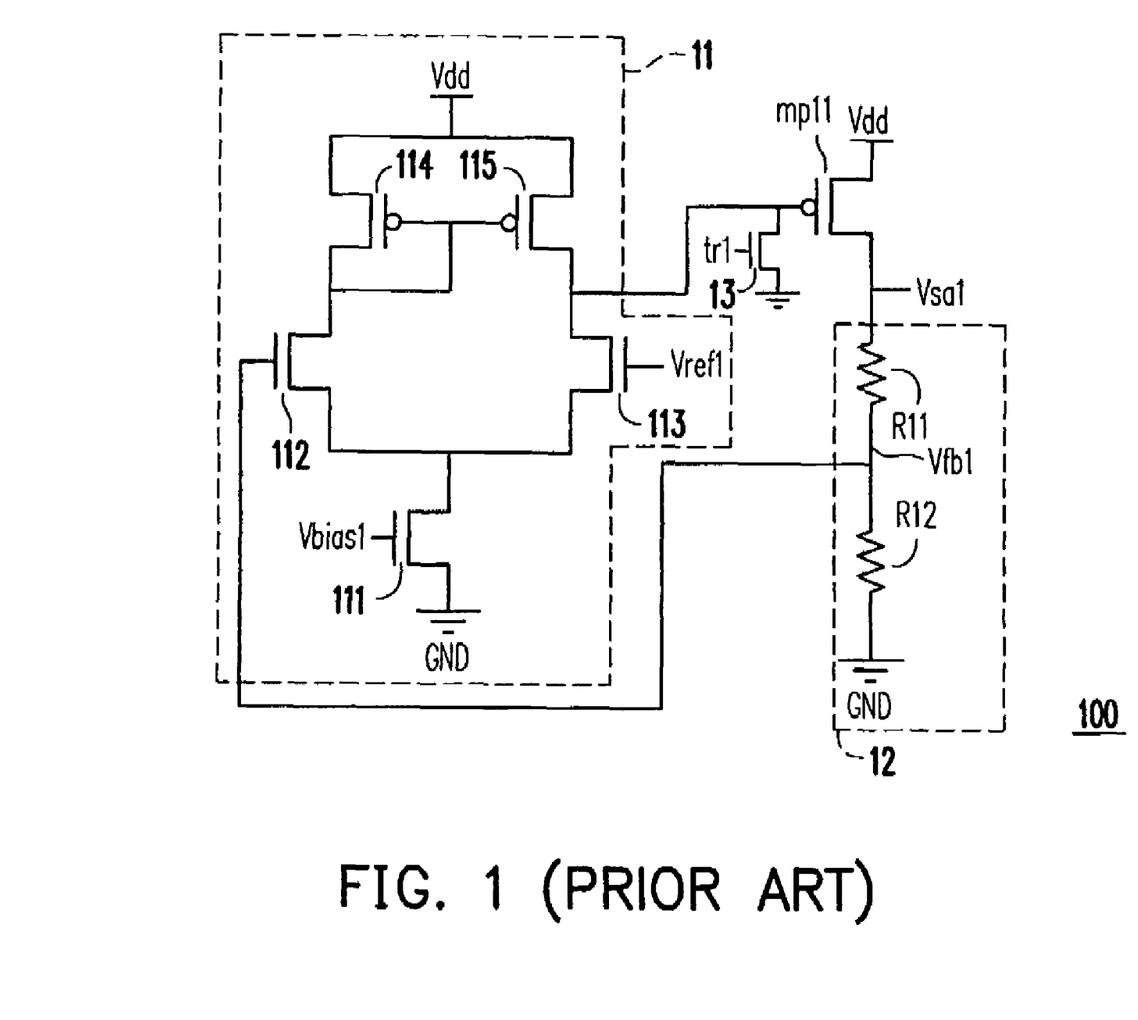
FIG. 1 is a circuit diagram of a conventional voltage regulator 100 for DRAM.

FIG. 1 is a circuit diagram of a conventional voltage regulator 100 for DRAM. The voltage regulator 100 includes a differential amplifier unit 11 as a comparator, a feedback unit 12, a PMOS driver transistor mp11, and a NMOS transistor 13.

The differential amplifier unit 11 includes a plurality of transistors 111~115. NMOS transistor 112 is connected in series with PMOS transistor 114. NMOS transistor 113 is connected in series with PMOS transistor 115. NMOS transistor 111 has its drain connected to the sources of both NMOS transistors 112 and 113, and its source connected to GND. The NMOS transistor 111, which gate is connected to a voltage Vbias1, provides a constant bias current for the differential amplifier unit 11. The NMOS transistor 112 detects Vfb1 from the feedback unit 12 and NMOS transistor 113 receives a reference voltage Vref1. The PMOS transistors 114 and 115, whose gates are connected together, constitute a current mirror. The PMOS transistor 114 has its gate and drain connected together and its source connected to a power supply Vdd. The PMOS transistor 115 is connected between the power supply Vdd and an output node of the differential amplifier unit 11. The PMOS driver transistor mp11, whose gate is connected to the output node of the differential amplifier unit 11, controls currents supplied from the power supply Vdd to the Vsa1 for internal circuits (not shown). The feedback unit 12, having resistors R11 and R12, adjusts the ratio of Vsa1 to the reference voltage Vref1. The feedback output voltage Vfb1 is equal to Vsa1*R12/(R11+R12). NMOS transistor 13, normally turned off, is turned on by a rising trigger signal tr1 to pull the gate voltage of PMOS driver transistor mp11 toward ground (GND) and supplies more current to Vsa1.

In operation, the differential amplifier unit 11 compares the feedback voltage Vfb1 with the reference voltage Vref1, and then applies the output signal to the gate of PMOS driver transistor mp11 to control the current and to regulate the internal power supply Vsa1 for DRAM cell array. If Vsa1 is lower and Vfb1 is less than Vref1, the gate of PMOS driver transistor mp11 will attain toward ground to raise Vsa1. While Vsa1 is getting higher, Vfb1 is rising toward Vref1 and the gate of PMOS driver transistor mp11 will attain toward Vdd to turn off PMOS driver transistor mp11 and stop the Vsa1 rising. In steady state, Vfb1 is equal to Vref1 and Vsa1 is regulated at Vref1*(R11+R12)/R12.

To prevent the excessive drop-down of Vsa1 during bit line sensing, which degrades the DRAM performance, the NMOS transistor 13, turned on and controlled by a trigger signal tr1, pulls down the gate voltage of PMOS driver transistor mp11 toward GND to supply more current and to raise the Vsa1 level in advance. This "reset" action prevents some excessive drop-down of Vsa1 voltage at bit line sensing afterwards. Due to lack of feedback from Vsa1 in controlling the "reset" and duo to slow response of the differential amplifier unit 11, Vsa1 is easier to be raised and dropped excessively.

The circuit in FIG. 1 has some drawbacks. Because there is no feedback from Vsa1 to control the turn-on "H" duration tr1 before large current consumption in Vsa1, Vsa1 may be pulled too high in case of high Vdd. Further, Tr1 goes low after large current consumption in Vsa1; and Vsa1 may be pulled too high or too low if the differential amplifier unit 11 responds slowly.

Figure 2:
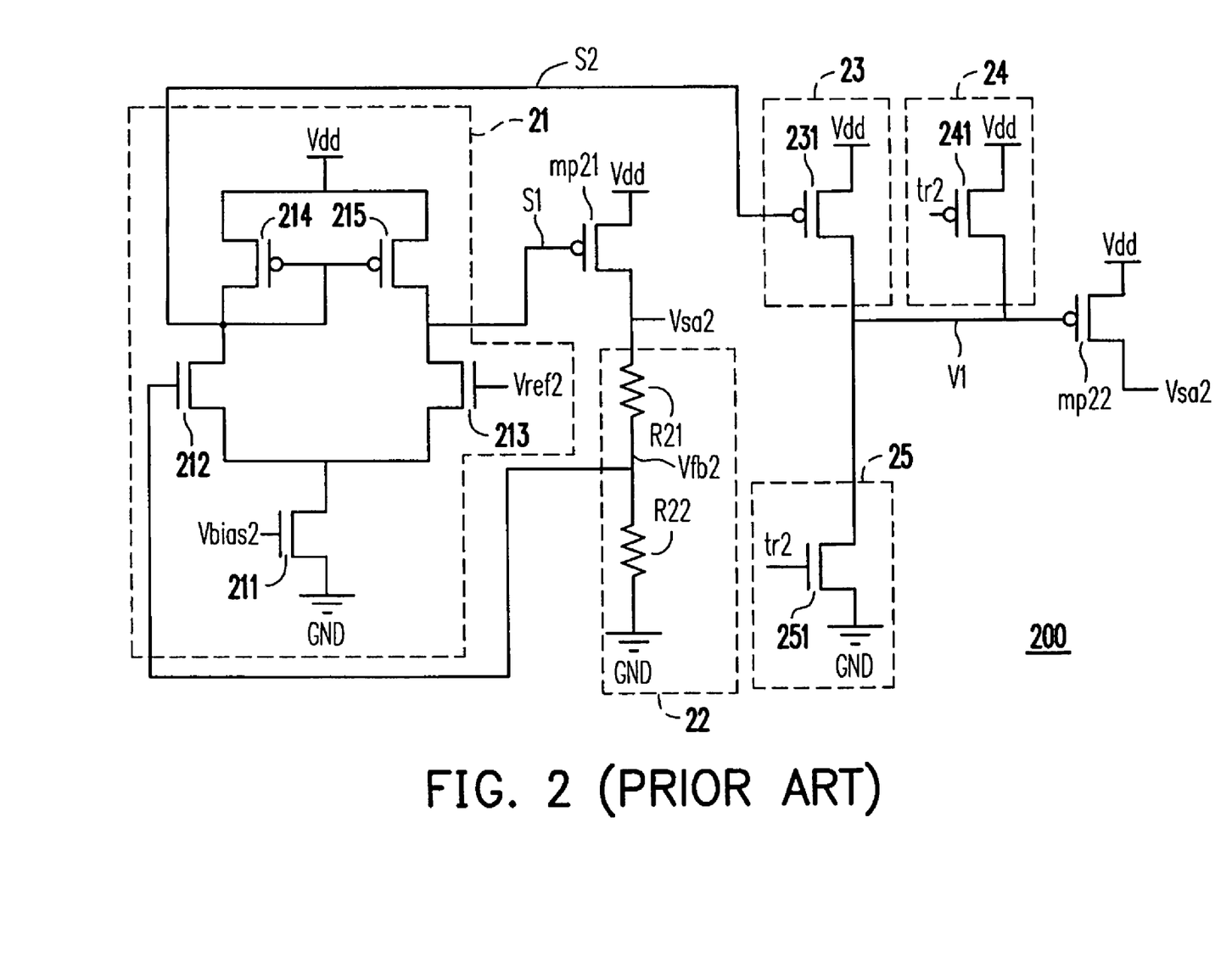
FIG. 2 is a circuit diagram of another conventional voltage regulator 200 for DRAM.

FIG. 2 shows another prior voltage regulator 200. The voltage regulator 200 includes a comparing unit 21, PMOS driver transistors mp21 and mp22, a feedback unit 22, a control unit 23 and switches 24 and 25. The comparing unit 21, as a differential amplifier, includes NMOS transistors 211~213 and PMOS transistors 214-215. The comparing unit 21 differentiates a first signal from the feedback unit 22 with a voltage reference Vref2 to output a large swing amplifying signal S1 and a smaller swing complementary amplifying signal S2. The NMOS transistor 211 receives a gate voltage Vbias2 and supplies a biasing current for the comparing unit 21. Signal S1 controls the PMOS drive transistor mp21 to output an internal supply voltage Vsa2 for DRAM memory cells. The smaller swing complementary amplifying signal S2, output from the drain of the diode-connected PMOS transistor 214, controls the control unit 23. The feedback unit 22, including resistors R21 and R22, receives Vsa2 and generates a feedback signal Vfb2, based on the impedance ratio of R21 to R22, to an input of the comparing unit 21. The PMOS driver transistor mp21 provides a first control path to the internal supply voltage Vsa2 and the PMOS driver transistor mp22 provides a second control path to the internal supply voltage Vsa2. The control unit 23, including a PMOS transistor 231, is coupled to the comparing unit 21. The control unit 23 receives the smaller swing complementary amplifying signal S2 to output a control voltage V1 to the gate of the PMOS driver transistor mp22. The switch 24, including a PMOS transistor 241, is coupled to the PMOS driver transistor mp22 and receives a trigger signal tr2 for raising the control voltage V1 toward the power supply voltage Vdd. The switch 25, including an NMOS transistor 251, is also coupled to the PMOS driver transistor mp22 and receives the trigger signal tr2 to drop the control voltage V1 toward the ground voltage.

In normal operation without abrupt change in current consumption, Vsa2 is regulated at Vref2*(R21+R22)/R22 by the comparing unit 21, the PMOS driver transistor mp21 and the feedback unit 22. The output signal S1 of the comparing unit 21 is biased at a certain level such that the PMOS driver transistor mp22 just supplies the quiescent Vsa2 standby current. The complementary amplifying signal S2, which is the gate bias of the current mirror PMOS transistors 214-215, sets the gate bias of the PMOS transistor 231. The control voltage V1 input to the gate of the PMOS drive transistor mp22 is set at VDD until the trigger signal tr2 is rising.

Prepared for abrupt current consumption during the bit line sensing, the NMOS transistor 251, turned on by a rising trigger signal tr2, pulls down the gate voltage V1 of the second PMOS driver transistor mp22 to raises the internal supply voltage Vsa2 in advance. This "reset" action prevents the excessive drop-down of the internal supply voltage Vsa2. The PMOS transistor 231, which is controlled by the complementary amplifying signal S2 from the comparing unit 21, holds the control voltage V1 and restrains reset on the internal supply voltage Vsa2. After reset, a falling trigger signal tr2 turns-off the NMOS transistor 251 and turns on the PMOS transistor 241, raises the control voltage V1 to VDD to shut off the PMOS driver transistor mp22.

However, in the structure of FIG. 2, the comparing unit 21 is also of slow response because the bias current thereof is only provided by the NMOS transistor 211. Further, at the beginning of bit line sensing, currents provided by the PMOS driver transistor mp22 to Vsa2 may be not enough.

Figure 3:
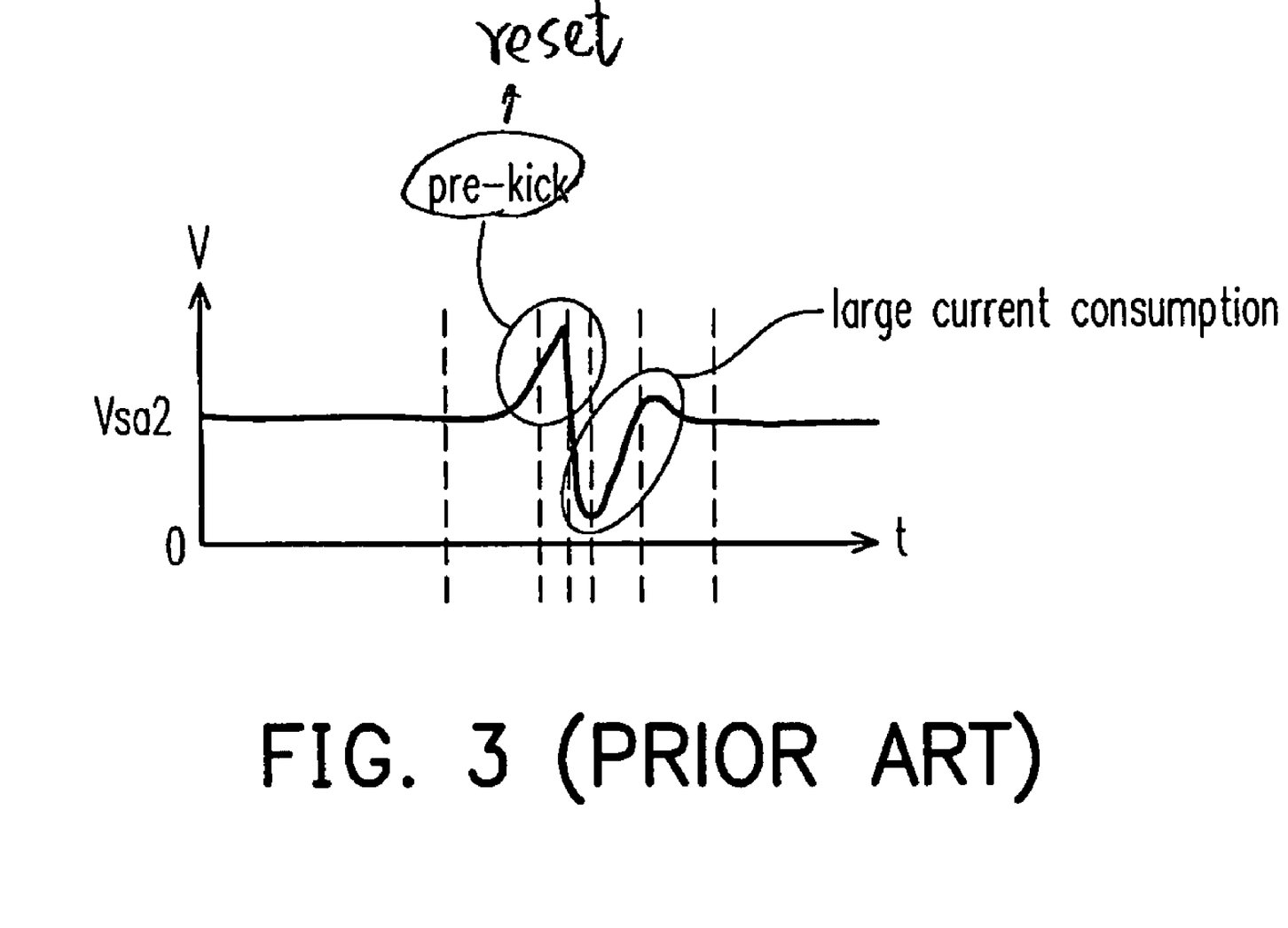
FIG. 3 is a timing diagram of the prior art voltage regulator 200.

FIG. 3 is a timing chart of the voltage regulator 200 illustrated in FIG. 2. The horizontal axis represents the time, and the vertical axis represents the voltage. Before bit line sensing operation, Vsa2 is reset.

In U.S. Pat. No. 6,195,298 B2, another voltage down converter for supplying a voltage and current to semiconductor devices is provided. However, the voltage down converter, having three amplifiers, is more complex and has higher manufacturing cost.

SUMMARY OF THE INVENTION

The invention provides a voltage regulator in a semiconductor memory, such as DRAM and SRAM, which is simpler in circuit design, resulting reduced manufacturing cost.

The invention provides a voltage regulator in a semiconductor memory, in which an operational amplifier is of quick response during sensing operations.

The invention provides a voltage regulator in a semiconductor memory, an internal supply voltage regulated by the voltage regulator being reset before sensing operations.

One example of the invention provides a voltage regulator in a semiconductor memory for generating an internal supply voltage from a power supply, the voltage regulator comprising: a current mirror; a first transistor group, coupled to the current mirror, being controlled by the internal supply voltage; a second transistor group, coupled to the current mirror, being controlled by a first signal and a first reference voltage; a third transistor group, coupled to the current mirror, being controlled by the first signal and a second reference voltage; a first bias current source, coupled to the first, the second and the third transistor groups, for providing a first bias current to the first, the second and the third transistor groups; and a driver transistor, coupled to the current mirror, the second transistor group and the third transistor group, for outputting the internal supply voltage.

Another example of the invention provides a voltage regulator in a semiconductor memory for generating an internal supply voltage from a power supply, the voltage regulator comprising: a comparing unit, including first and second bias current sources, the comparing unit comparing the internal supply voltage with first and second reference voltages under control of a first signal, the second reference voltage being higher than the first reference voltage, the first bias current source being always ON while the second bias current source being ON under control of a second signal; and a driver active element, coupled to the comparing unit, for outputting the internal supply voltage; wherein before sensing operations of the semiconductor memory, the internal supply voltage being reset to the second reference voltage; during the sensing operations, the internal supply voltage being maintained at the first reference voltage for device reliability; and after the sensing operations, the internal supply voltage being reset to the second reference voltage; during the sensing operations, the second signal being asserted for turning ON the second bias current source for raising speed of the comparing unit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

In embodiments of the invention, before large current consumption (for example, bit line sensing), an internal supply voltage for internal circuits inside semiconductor memory is pre-set to a higher reference level. During DRAM activated, the internal supply voltage is maintained at a lower reference level for device reliability. After large current consumption, the internal supply voltage is re-set to the higher reference level. During bit line sensing, in order to raise operation speed of an operational amplifier, large bias current is provided to the operational amplifier, so that the internal supply voltage will not go down too deep in the beginning of large current consumption.

Figure 4:
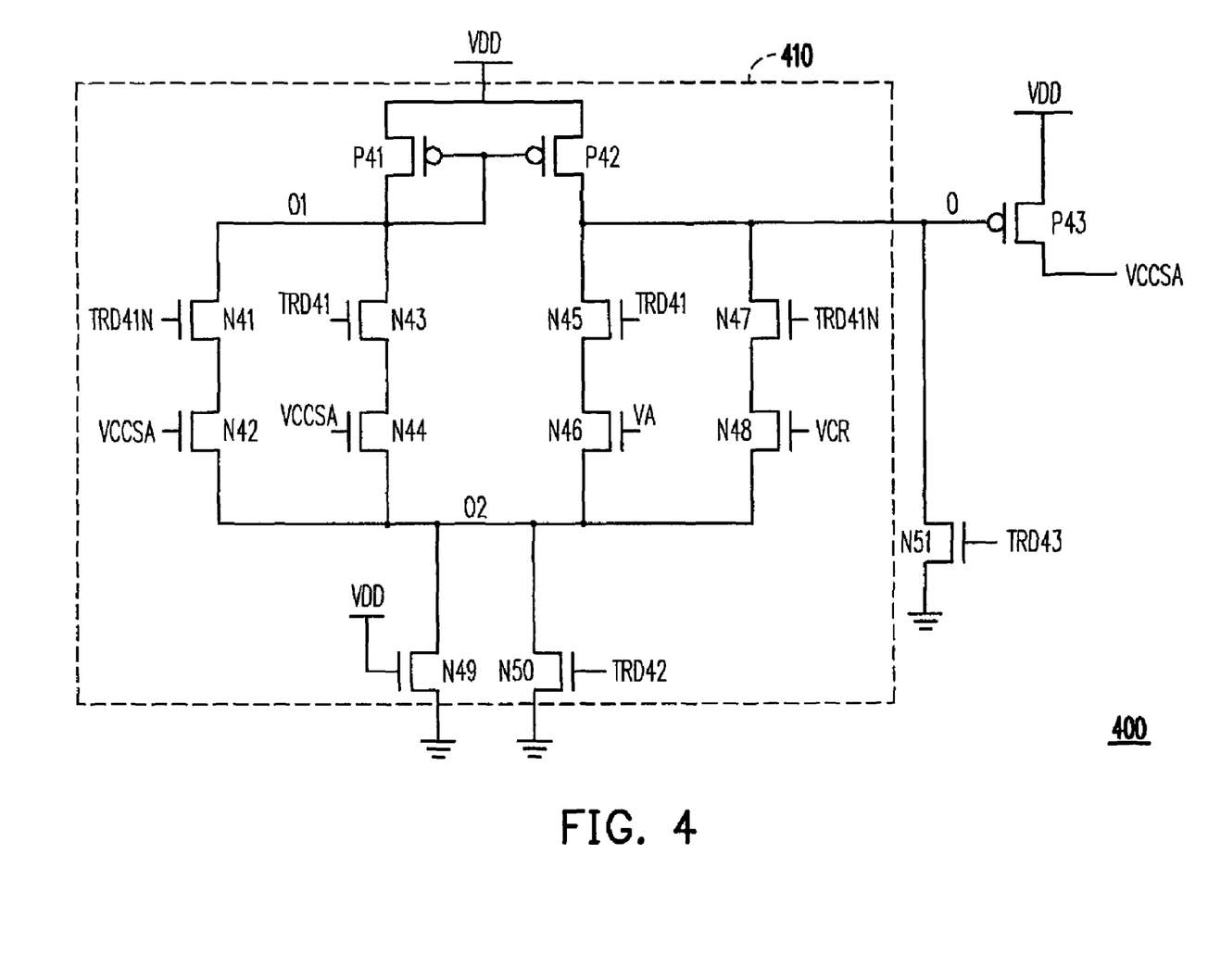
FIG. 4 shows a voltage regulator according to an embodiment of the invention.
Figure 5:
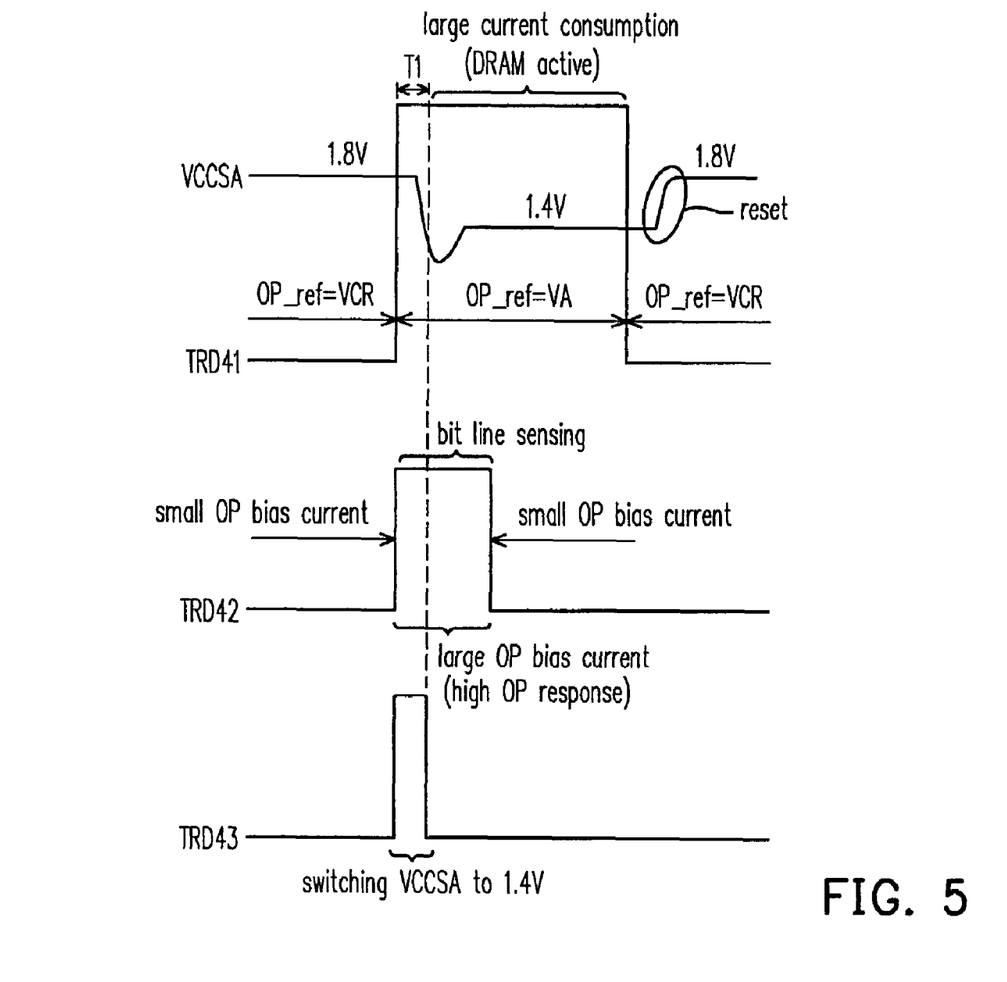
FIG. 5 shows a timing diagram in the voltage regulator according to the embodiment of the invention.

FIG. 4 shows a voltage regulator according to an embodiment of the invention and FIG. 5 shows a timing diagram in FIG. 4.

Now refer to FIG. 4, the voltage regulator 400 includes a comparing unit (differentiating operation amplifier) 410, a PMOS driver transistor P43, and an NMOS transistor N51. The comparing unit 410 includes NMOS transistors N41~N50 and PMOS transistors P41~P42. The comparing unit 410 differentiates an internal supply voltage VCCSA with one of the reference voltages VA and VCR, to output a large swing amplifying node voltage O (i.e. node O is an output voltage of the comparing unit 410). The NMOS transistor N49 receives the power supply VDD and supplies a biasing current for the comparing unit 410. The node voltage O controls the PMOS drive transistor P43 to output the internal supply voltage VCCSA for DRAM memory cells.

The PMOS transistor P41 has a source terminal coupled to VDD, a gate terminal coupled to the node O1 and a drain terminal coupled to the node O1. Similarly, the PMOS transistor P42 has a source terminal coupled to VDD, a gate terminal coupled to the node O1 and a drain terminal coupled to the node O. The PMOS transistors P41 and P42 form a current mirror.

The NMOS transistor N41 has a source terminal coupled to a drain terminal of the NMOS transistor N42, a gate terminal coupled to a signal TRD41N (which is an inverted signal of a signal TRD41) and a drain terminal coupled to the node O1. The signal TRD41 is asserted when the semiconductor memory is activated for read, write or refresh operation.

The NMOS transistor N42 has a source terminal coupled to a node O2, a gate terminal coupled to VCCSA and a drain terminal coupled to the source terminal of the NMOS transistor N41. The NMOS transistors N41 and N42 form a first serially connected transistor group.

The NMOS transistor N43 has a source terminal coupled to a drain terminal of the NMOS transistor N44, a gate terminal coupled to the signal TRD41 and a drain terminal coupled to the node O1.

The NMOS transistor N44 has a source terminal coupled to the node O2, a gate terminal coupled to VCCSA and a drain terminal coupled to the source terminal of the NMOS transistor N43. The NMOS transistors N43 and N44 form a second serially connected transistor group.

The NMOS transistor N45 has a source terminal coupled to a drain terminal of the NMOS transistor N46, a gate terminal coupled to the signal TRD41 and a drain terminal coupled to the node O.

The NMOS transistor N46 has a source terminal coupled to the node O2, a gate terminal coupled to the reference voltage VA and a drain terminal coupled to the source terminal of the NMOS transistor N45. The NMOS transistors N45 and N46 form a third serially connected transistor group.

The NMOS transistor N47 has a source terminal coupled to a drain terminal of the NMOS transistor N48, a gate terminal coupled to the signal TRD41N and a drain terminal coupled to the node O.

The NMOS transistor N48 has a source terminal coupled to the node O2, a gate terminal coupled to the reference voltage VCR and a drain terminal coupled to the source terminal of the NMOS transistor N47. The NMOS transistors N47 and N48 form a fourth serially connected transistor group.

The NMOS transistor N49 has a grounded source terminal, a gate terminal coupled to VDD and a drain terminal coupled to the node O2. The NMOS transistor N50 has a grounded source terminal, a gate terminal coupled to another pulse TRD42 and a drain terminal coupled to the node O2. The NMOS transistors N49 and N50 provide bias currents for the comparing unit 410. Further, the NMOS transistor N49 is always ON but the NMOS transistor N50 is turned ON or OFF by the pulse TRD42. Alternatively, the NMOS transistors N49 and N50 may be controlled by a fixed voltage, which may be provided by other biasing circuits. Still further, passive resistors could also be used to provide bias currents to the comparing unit 410.

The PMOS driver transistor P43 has a source terminal coupled to VDD, a gate terminal coupled to the node O and a drain terminal for outputting VCCSA. The NMOS transistor N51 has a grounded source terminal, a gate terminal coupled to another pulse TRD43 and a drain terminal coupled to the node O. The NMOS transistor N51 is a weak transistor. The NMOS transistor N51 is used for setting the node voltage O away from VDD at the beginning of bit line sensing.

Now refer to FIGS. 4 and 5 for operation of the voltage regulator 400. In this embodiment, VA is for example 1.4V and VCR is for example 1.8V. So, the NMOS transistors N46 and N48 are always turned ON. Besides, the NMOS transistors N42 and N44 are also always turned ON because their gate voltage VCCSA is either 1.8V or 1.4V.

When DRAM is in pre-charge phase, the signal TRD41 is logic LOW while the signal TRD41N is logic HIGH. The NMOS transistors N41 and N47 are turned ON and the NMOS transistors N43 and N45 are turned OFF. So, the comparator receives VCR (1.8V) as reference level, (OP_ref=VCR in FIG. 5) and VCCSA will be pre-set to 1.8V. This higher preset voltage prevents the internal supply voltage VCCSA from dropping down too much during bit line sensing.

When DRAM is activated for read, write or refresh, the signal TRD41 is logic HIGH while the signal TRD41N is logic LOW. The NMOS transistors N41 and N47 are turned OFF and the NMOS transistors N43 and N45 are turned ON. So, the reference level of the comparator is VA (1.4V), and VCCSA is regulated at 1.8V.

In FIG. 5, in T1, TRD41 goes high for bit line sensing while VCCSA has not yet consumed high current and accordingly VCCSA is still maintained at 1.8V. After T1, bit line sensing begins, and VCCSA is pulled down and then maintained at 1.4V for ensuring the device reliability. After DRAM completes activation operation and returns to pre-charge state, the signal TRD41 goes LOW for resetting VCCSA as 1.8V. This means, in the embodiment, VCCSA is re-set to higher voltage level after DRAM completes activation operation and returns to pre-charge state. But in prior art, VCCSA is reset only at some duration around the beginning of bit line sensing.

The pulse TRD42 is a pulse signal for DRAM sensing. In the period of TRD42 at HIGH (the NMOS transistor N50 being turned ON), the comparing unit 410 has faster speed for keeping VSSCA from dropping too deep during the beginning of bit line sensing. During TRD42 at HIGH, the bias currents of the comparing unit 410 are provided by both the NMOS transistors N49 and N50, and the comparing unit 410 has faster response. After VCCSA is kept at 1.4V (VA) by the comparing unit 410, the pulse TRD42 goes LOW for turning OFF the NMOS transistor N50 and for reducing the bias current and power consumption of the comparing unit 410.

During T1, i.e. the duration of HIGH TRD41 before bit line sensing, it is better to keep the node O away from the power supply VDD and to provide little sub-threshold current flowing through the PMOS driver transistor P43 into VCCSA. So, after rising of the signal TRD41, the pulse TRD43 goes HIGH for turning ON the NMOS transistor N51 and keeping the node O away from VDD while the reference input of the comparing unit 410 (i.e. OP_ref) is switched lower from 1.8V to 1.4V.

In this embodiment, during DRAM precharge phase, VCCSA is kept at 1.8V; while after DRAM completes activation operation and returns to pre-charge state, VCCSA is kept at 1.4. So, it is easier to control for wide range power supply VDD.

Figure 6:
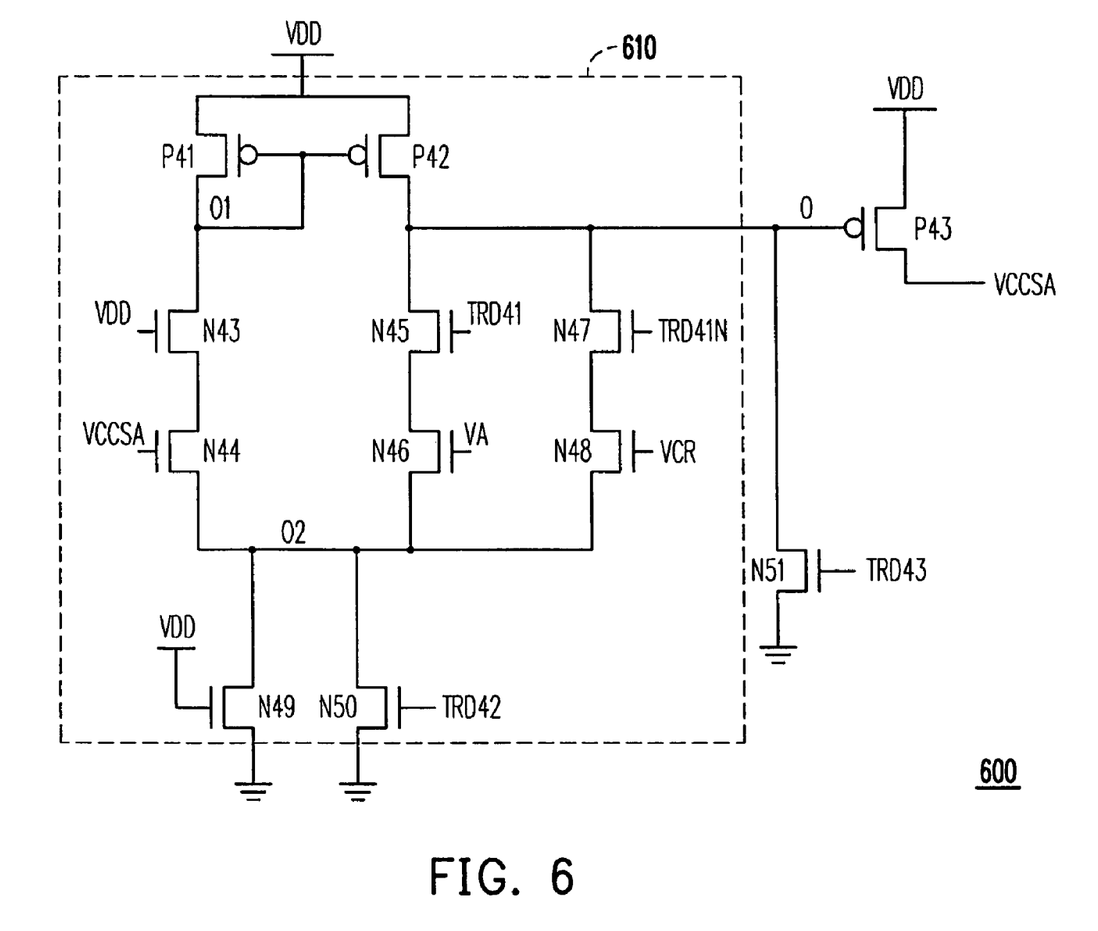
FIG. 6 shows a voltage regulator according to another embodiment of the invention.

FIG. 6 shows a voltage regulator according to another embodiment of the invention.

Now refer to FIG. 6, the voltage regulator 600 includes a comparing unit (differentiating operation amplifier) 610, a PMOS driver transistor P43, and an NMOS transistor N51. The comparing unit 610 includes NMOS transistors N43~N50 and PMOS transistors P41~P42. The comparing unit 610 in FIG. 6 has similar circuit structure and functions with the comparing unit 410 in FIG. 4. While, the gate terminal of the NMOS transistor N43 in the comparing unit 610 in FIG. 6 is coupled to the power supply VDD, rather than to the pulse signal TRD41.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A voltage regulator in a semiconductor memory for generating an internal supply voltage from a power supply, the voltage regulator comprising:
   a current mirror;
   a first transistor group, coupled to the current mirror, being controlled by the internal supply voltage;
   a second transistor group, coupled to the current mirror, being controlled by a first signal and a first reference voltage;
   a third transistor group, coupled to the current mirror, being controlled by the first signal and a second reference voltage;
   a first bias current source, coupled to the first, the second and the third transistor groups, for providing a first bias current to the first, the second and the third transistor groups; and
   a driver transistor, coupled to the current mirror, the second transistor group and the third transistor group, for outputting the internal supply voltage.

2. The voltage regulator of claim 1, wherein the first transistor group comprising:
   a first transistor, having a first terminal coupled to the current mirror, a control terminal coupled to the power supply and a second terminal; and
   a second transistor, having a first terminal coupled to the second terminal of the first transistor, a control terminal coupled to the internal supply voltage and a second terminal coupled to the first bias current source.

3. The voltage regulator of claim 2, wherein the first transistor group further includes:
   an eighth transistor, having a first terminal coupled to the current mirror, a control terminal coupled to the power supply and a second terminal; and
   a ninth transistor, having a first terminal coupled to the second terminal of the eighth transistor, a control terminal coupled to the internal supply voltage and a second terminal coupled to the first bias current source.

4. The voltage regulator of claim 1, wherein the second transistor group comprising:
   a third transistor, having a first terminal coupled to the current mirror, a control terminal coupled to the first signal and a second terminal; and
   a fourth transistor, having a first terminal coupled to the second terminal of the third transistor, a control terminal coupled to the first reference voltage and a second terminal coupled to the first bias current source.

5. The voltage regulator of claim 1, wherein the third transistor group comprising:
   a fifth transistor, having a first terminal coupled to the current mirror, a control terminal coupled to an inverted signal of the first signal and a second terminal; and
   a sixth transistor, having a first terminal coupled to the second terminal of the fifth transistor, a control terminal coupled to the second reference voltage and a second terminal coupled to the first bias current source.

6. The voltage regulator of claim 1, wherein the first bias current source is controlled by the power supply or a fixed voltage.

7. The voltage regulator of claim 1, further comprising:
   a second bias current source, coupled to the first, the second and the third transistor groups, for providing a second bias current to the first, the second and the third transistor groups under control of a second signal.

8. The voltage regulator of claim 7, wherein the second signal is asserted for raising comparison speed of the voltage regulator during which the first signal is asserted.

9. The voltage regulator of claim 1, further comprising:
   a level keeping active element, coupled to the current mirror and the driver transistor, for setting an output level of the current mirror under control of a third signal.

10. The voltage regulator of claim 9, wherein the third signal is asserted for setting an output level of the current mirror.

11. The voltage regulator of claim 1, wherein the first signal is asserted when the semiconductor memory is activated for read, write or refresh operation.

12. A voltage regulator in a semiconductor memory for generating an internal supply voltage from a power supply, the voltage regulator comprising:
   a comparing unit, including first and second bias current sources, the comparing unit comparing the internal supply voltage with first and second reference voltages under control of a first signal, the second reference voltage being higher than the first reference voltage, the first bias current source being always ON while the second bias current source being ON under control of a second signal; and
   a driver active element, coupled to the comparing unit, for outputting the internal supply voltage;
   wherein
   before sensing operations of the semiconductor memory, the internal supply voltage being reset to the second reference voltage; during the sensing operations, the internal supply voltage being maintained at the first reference voltage for device reliability; and after the sensing operations, the internal supply voltage being reset to the second reference voltage;
   during the sensing operations, the second signal being asserted for turning ON the second bias current source for raising speed of the comparing unit.

13. The voltage regulator of claim 12, further comprising:
   a level keeping active element, coupled to the comparing unit, for setting an output level of the comparing unit under control of a third signal;
   wherein after the semiconductor memory being activated but before the sensing operations, the third signal is asserted for setting an output voltage of the comparing unit.

14. The voltage regulator of claim 12, wherein the comparing unit further comprises:
   a current mirror;
   a first transistor group, coupled to the current mirror, being controlled by the internal supply voltage;
   a second transistor group, coupled to the current mirror, being controlled by the first signal and the first reference voltage; and
   a third transistor group, coupled to the current mirror, being controlled by the first signal and the second reference voltage.

15. The voltage regulator of claim 12, wherein the first bias current source is controlled by the power supply or a fixed voltage.

16. The voltage regulator of claim 12, wherein the first signal is asserted when the semiconductor memory is activated for read, write or refresh operation.

17. The voltage regulator of claim 16, wherein the second signal is asserted for raising comparison speed of the voltage regulator during which the first signal is asserted.

* * * * *